(12) United States Patent
Kasahara et al.

(10) Patent No.: US 11,361,876 B2
(45) Date of Patent: Jun. 14, 2022

(54) INTEGRALLY FORMED PRODUCT, AND COMPOSITE MATERIAL, TERMINAL FOR ELECTRICAL CONTACT AND PRINTED WIRING BOARD INCLUDING THE INTEGRALLY FORMED PRODUCT

(71) Applicant: FURUKAWA ELECTRIC CO., LTD., Tokyo (JP)

(72) Inventors: Masayasu Kasahara, Tokyo (JP); Akira Tachibana, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 161 days.

(21) Appl. No.: 16/584,825

(22) Filed: Sep. 26, 2019

(65) Prior Publication Data

US 2020/0043627 A1    Feb. 6, 2020

Related U.S. Application Data

(63) Continuation of application No. PCT/JP2018/012778, filed on Mar. 28, 2018.

(30) Foreign Application Priority Data

Mar. 29, 2017 (JP) ............... JP2017-066042

(51) Int. Cl.
*C22C 49/14* (2006.01)
*H01B 1/02* (2006.01)
(Continued)

(52) U.S. Cl.
CPC ............. *H01B 1/02* (2013.01); *C22C 1/10* (2013.01); *C22C 32/0094* (2013.01);
(Continued)

(58) Field of Classification Search
CPC ......... H01B 1/02; C22C 1/10; C22C 32/0094; C22C 49/14; C22C 49/00; C25D 1/04;
(Continued)

(56) References Cited

U.S. PATENT DOCUMENTS 3,652,236 A    3/1972 Odekerken
4,269,859 A *  5/1981 Morse ................. A61K 9/2054
                                                264/117
(Continued)

FOREIGN PATENT DOCUMENTS

CN    102493265 A    6/2012
CN    105369301 A    3/2016
(Continued)

OTHER PUBLICATIONS

Y. Wang et al. "Direct electrodeposition of carboxymethyl cellulose based on coordination deposition method", 2018, Cellulose, 25, p. 105-115. (Year: 2018).*
(Continued)

*Primary Examiner* — Seth Dumbris
(74) *Attorney, Agent, or Firm* — Dorsey & Whitney LLP (57) ABSTRACT

The present disclosure relates to an integrally formed product including a metal and a fiber of biological origin disposed in dispersed state in the metal. A proportion by mass of the fiber of biological origin contained in the integrally formed product is within a range of 0.02 mass % or more and 10 mass % or less.

15 Claims, 2 Drawing Sheets

(51) Int. Cl.

| | | |
|---|---|---|
| *C22C 1/10* | (2006.01) | |
| *C25D 1/04* | (2006.01) | |
| *H01R 13/03* | (2006.01) | |
| *H05K 1/09* | (2006.01) | |
| *C22C 32/00* | (2006.01) | |
| *C25D 15/02* | (2006.01) | |
| *C25D 7/00* | (2006.01) | |
| *C22C 49/00* | (2006.01) | |

(52) U.S. Cl.
CPC .............. *C22C 49/14* (2013.01); *C25D 1/04* (2013.01); *C25D 7/00* (2013.01); *C25D 15/02* (2013.01); *H01R 13/03* (2013.01); *H05K 1/092* (2013.01); *C22C 49/00* (2013.01); *H05K 2201/0278* (2013.01); *H05K 2201/0287* (2013.01); *H05K 2201/0293* (2013.01); *Y10T 428/249927* (2015.04)

(58) Field of Classification Search
CPC .......... C25D 7/00; C25D 15/02; H01R 13/03; H05K 1/092; H05K 2201/0278; H05K 2201/0287; H05K 2201/0293; Y10T 428/249927
USPC ....................................................... 428/293.1
See application file for complete search history.

(56) References Cited

U.S. PATENT DOCUMENTS

| | | | | |
|---|---|---|---|---|
| 5,008,158 | A | * 4/1991 | Fang | ........................ C22C 49/00 164/97 |
| 9,987,686 | B2 | 6/2018 | Isogai | |
| 10,392,519 | B2 * | 8/2019 | Dietsch | .............. H01B 13/0036 |
| 2015/0017464 | A1 | 1/2015 | Tanaka et al. | |
| 2017/0006701 | A1 * | 1/2017 | Casasanta, III | ....... B32B 27/285 |
| 2017/0072472 | A1 | 3/2017 | Isogai | |
| 2020/0043627 | A1 | 2/2020 | Kasahara | |

FOREIGN PATENT DOCUMENTS

| | | | |
|---|---|---|---|
| CN | 106222718 | A | 12/2016 |
| CN | 110462111 | A | 11/2019 |
| EP | 3141323 | A1 | 3/2017 |
| GB | 1118167 | A | 6/1968 |
| JP | H01277217 | A | 11/1989 |
| JP | H08321303 | A * | 12/1996 .............. H01M 4/26 |
| JP | H08329956 | A * | 12/1996 .............. H01M 4/24 |
| JP | H11277217 | A | 10/1999 |
| JP | 2008293883 | A | 12/2008 |
| JP | 5566368 | B2 | 6/2014 |
| WO | 2010095574 | A1 | 8/2010 |
| WO | 2013100147 | A1 | 7/2013 |
| WO | 2015170613 | A1 | 11/2015 |

OTHER PUBLICATIONS

Nickel Institute "Nickel Plating Handbook", 2014, Nickel Institute, p. 1-80. (Year: 2014).*
Department of Defense "Dissimilar Metals", 2016, Department of Defense, MIL-STD-889C, p. 1-26. (Year: 2016).*
Extended European Search Report for EP Application No. 18774867.8, dated Dec. 21, 2020.
Tentori, Augusto M. et al., "Fabrication and Applications of Biological Fibers", BioDesign, vol. 2, No. 3, Sep. 2014, pp. 69-80.
Vathsala, Kanagalasara et al., "Electrochemical Generation Of Zn-Chitosan Composite Coating On Mild Steel and Its Corrosion Studies", Engineering, vol. 2, No. 8, Jan. 2010, pp. 580-584.
English Translation of International Preliminary Report on Patentability Chapter I received in PCT/JP2018/012778, dated Oct. 1, 2019.
English Translation of the Written Opinion of the International Search Authority received in PCT/JP2018/012778, dated Jul. 3, 2018.
English translation of Office Action for CN Application No. 201880020155.8, dated Dec. 21, 2020.
International Search Report and Written Opinion received in PCT/JP2018/012778 dated Jul. 3, 2018 (Engl. translation of ISR only).
[English Translation] 2nd OA dated May 26, 2020, for CN application No. 201880020155.8.
[English Translation] First Office Action dated Jan. 5, 2022 for Taiwanese Patent Application No. 107110939; pp. all.
[English Translation] Notice of Reasons for Refusal dated Dec. 14, 2021 for Japanese Patent Application No. 2019-509977; pp. all.
[English Translation] Notice of Reasons for Refusal dated Mar. 7, 2022 for Japanese Patent Application No. 2019-509977; pp. all.
[English Translation] Notification of Reasons for Refusal dated Mar. 29, 2022 for Korean Patent Application No. 10-2019-7027426.

* cited by examiner

INTEGRALLY FORMED PRODUCT, AND COMPOSITE MATERIAL, TERMINAL FOR ELECTRICAL CONTACT AND PRINTED WIRING BOARD INCLUDING THE INTEGRALLY FORMED PRODUCT

CROSS REFERENCE TO RELATED APPLICATIONS

This is a continuation application of International Patent Application No. PCT/JP2018/012778 filed Mar. 28, 2018, which claims the benefit of Japanese Patent Application No. 2017-066042 filed Mar. 29, 2017, and the full contents of all of which are hereby incorporated by reference in their entirety.

BACKGROUND

Technical Field

The present disclosure relates to a novel integrally formed product capable of achieving enhancement of strength, weight reduction and improvement of a sliding property while suppressing degradation of material properties such as in particular excellent conductivity inherent in metals, as well as relates to a composite material, a terminal for electrical contact and a printed wiring board having such an integrally formed product.

Description of the Related Art

Generally, metal materials are widely used in various applications since they have excellent material properties such as conductivity. Furthermore, as a means of enhancing the strength of metal materials, it is useful to achieve alloying by adding an alloy ingredient to a matrix metal. However, in alloying of a metal material, the problem is that, in a position of regularly aligned metal atoms which constitute a crystal lattice in a matrix metal, the metal atoms are replaced with alloying atoms having different atomic radii, which leads to disorder of atom arrangement and thus strain of the crystal lattice, and as a result, material properties such as conductivity tend to degrade.

Furthermore, as another means of further enhancing the strength of metal materials, it is useful to form a composite material having nanoparticles such as a carbon fiber and glass fiber dispersed in a matrix metal. As nanoparticles used for such a composite material, suitable materials are selected according to the required performance of materials.

In recent years, attention has been focused on fibers of biological origin such as cellulose, chitin or chitosan in place of a carbon fiber and glass fiber. Among these, for example, cellulose fiber has excellent tensile strength (about 3 GPa), and five times lower weight (lightweight) and five times higher strength (high strength) than iron-based materials. Since raw materials of a cellulose fiber are plants, a cellulose fiber is highly advantageous for Japan in which 70% of the country is forest. Furthermore, a cellulose fiber is made from plants and thus has a low environmental load, and in addition, it is lighter and stronger than iron, and thus expected to be used in a wide variety of fields. Furthermore, a cellulose fiber is a form of nanocellulose obtained by loosening a plant fiber chemically and mechanically (fibrillation), and is fiber-shaped material in which each fiber has the diameter of 4 to 100 nm and length of 5 μm or more. Materials having such a shape are generally called fibers.

Fibers of biological origin have properties such as (1) high strength as well as being lightweight, (2) small deformation caused by heat, (3) high specific surface area, (4) high gas barrier property, (5) viscosity in water, (6) high transparency, (7) hydrophilicity. On the other hand, a carbon fiber is hydrophobic, and thus without surface modification treatment, a carbon fiber may often be difficult to be uniformly mixed with and dispersed in a solvent and other materials which constitute a composite material, when a composite material is manufactured. In addition, it is reported that a carbon fiber emits toxic materials that have carcinogenic property when heated at a high temperature, and thus use of a carbon fiber causes an environmental problem. Therefore, as an alternative to carbon fiber etc., investigations of fibers of biological origin have been in progress for the purpose of practical use of fibers of biological origin as reinforcing materials of synthetic resins such as plastic and rubber.

However, known techniques using fibers of biological origin cannot be found currently which illustrate an example in which a composite material is composed of a metal in combination with fibers of biological origin to achieve high strength.

Japanese Patent No. 5566368 discloses a method of obtaining a cellulose nanofiber carrying metal nanoparticles. However, the obtained metal particles remain in a surface layer part of cellulose, and thus it is not possible to obtain sufficient electric conductivity for industrial use as a metal material.

International Publication No. WO2015/170613 discloses a method of controlling the size of metal particles which are incorporated in a composite material together with cellulose. However, International Publication No. WO2015/170613 does not suggest a method of obtaining an integrally formed product and a composite material having both electrical conductivity and strength enough to be durable to processing of the material.

SUMMARY

The present disclosure is related to providing a novel integrally formed product and a composite material having thereof, wherein the integrally formed product is capable of achieving enhancement of strength, weight reduction and improvement of a sliding property while suppressing degradation of material properties as much as possible inherent in metals.

According to an aspect of the present disclosure, an integrally formed product includes a metal and a fiber of biological origin disposed in dispersed state in the metal. A proportion by mass of the fiber of biological origin contained in the integrally formed product is within a range of 0.02 mass % or more and 10 mass % or less.

Further, it is preferable that the fiber of biological origin is a cellulose fiber.

Further, it is preferable that the fiber of biological origin is a chitin or a chitosan fiber.

Further, it is preferable that the fibers of biological origin are dispersed in the metal under a state of being oriented in one direction or a state of being arranged in random directions.

Further, it is preferable that a decrease in conductivity of the integrally formed product is 30% or less on the basis of a conductivity of the metal.

Further, it is preferable that an increase in tensile strength of the integrally formed product is 5% or more on the basis of a tensile strength of the metal.

Further, it is preferable that a maximum value of dynamic friction coefficient of the integrally formed product is 0.8 times or less of that of the metal in a reciprocating sliding test in which a steel ball is used as a slider on a surface of the integrally formed product under a load of 100 gf and number of sliding of within 20 to 50.

Further, it is preferable that the metal is nickel, copper, palladium, silver, tin or gold.

Further, it is preferable that the metal is copper or tin.

Further, it is preferable that a proportion by mass of the fiber of biological origin contained in the integrally formed product is within a range of 0.02 mass % or more and 7 mass % or less.

According to another aspect of the present disclosure, a method of manufacturing the integrally formed product, the integrally formed product is formed by electroplating method.

According to another aspect of the present disclosure, a composite material includes the integrally formed product and a substrate having a surface on which the integrally formed product is formed.

Further, it is preferable that the substrate is a conductive substrate or an insulating substrate in the composite material.

According to another aspect of the present disclosure, a terminal for electrical contact includes the integrally formed product.

According to another aspect of the present disclosure, a printed wiring board includes the integrally formed product.

The present disclosure provides a novel integrally formed product formed from a metal and a fiber of biological origin disposed in dispersed state in the metal, and a composite material having thereof, wherein the integrally formed product is capable of achieving enhancement of strength, weight reduction and improvement of a sliding property while suppressing degradation of material properties as much as possible inherent in metals by controlling a proportion by mass of a fiber of biological origin contained in the integrally formed product within the particular range.

DETAILED DESCRIPTION

Hereinafter, embodiments of the integrally formed product and the composite material according to the present disclosure will be described in detail with reference to drawings.

Figure 1:
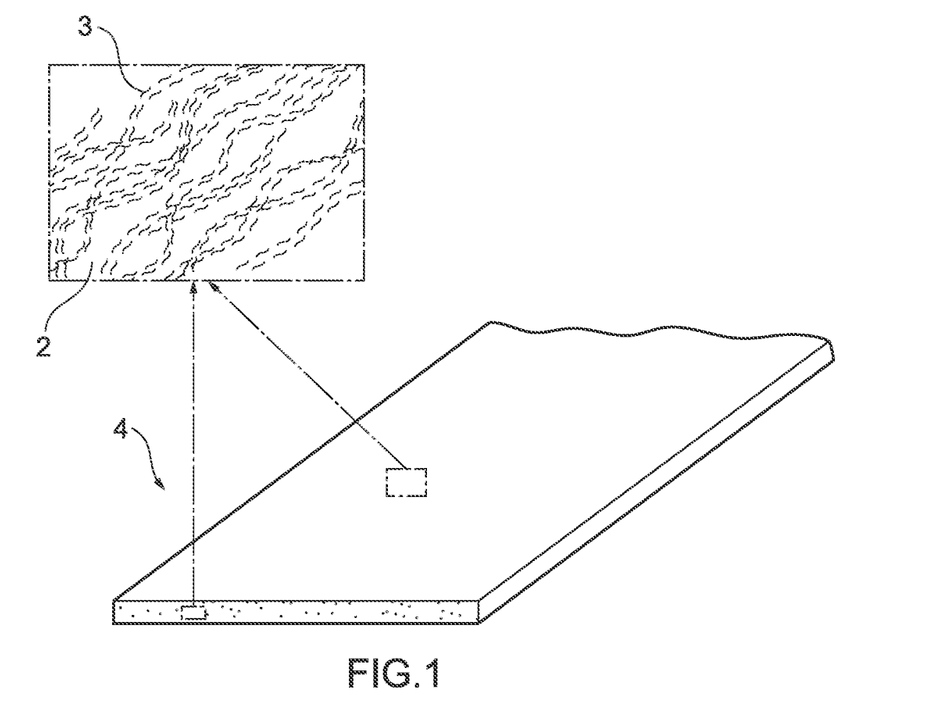
FIG. 1 is a schematic cross-sectional perspective view illustrating a representative embodiment of the integrally formed product according to the present disclosure, accompanied by an enlarged view of a part of surface or inside of the integrally formed product.
Figure 2:
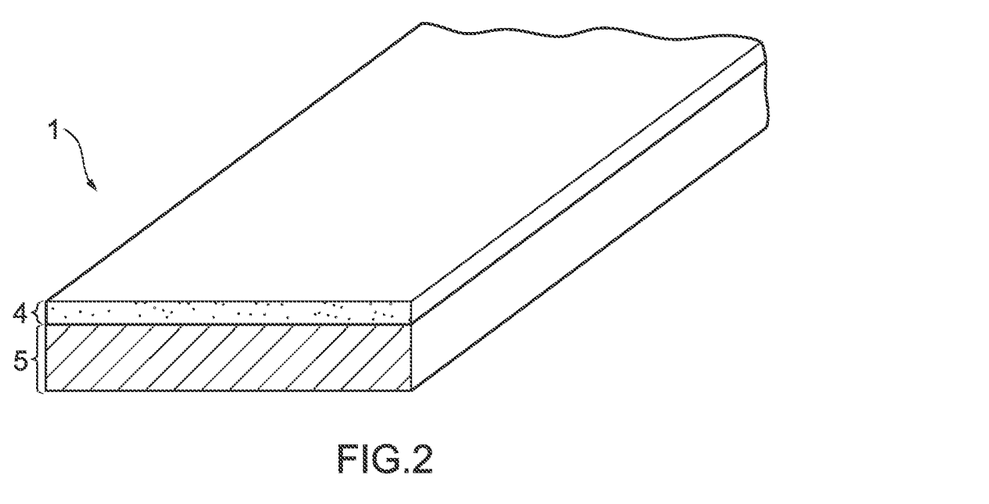
FIG. 2 is a schematic cross-sectional perspective view illustrating a representative embodiment of the composite material according to the present disclosure.

FIG. 1 shows a representative embodiment of the integrally formed product according to the present disclosure. In FIG. 1, reference numeral 4 denotes an integrally formed product, reference numeral 2 denotes a metal (matrix metal), reference numeral 3 denotes a fiber of biological origin. FIG. 2 shows a representative embodiment of the composite material according to the present disclosure. In FIG. 2, reference numeral 1 denotes a composite material, reference numeral 4 denotes an integrally formed product, and reference numeral 5 denotes a substrate.

As shown in FIG. 1, the integrally formed product 4 of the present disclosure has a metal 2 and a fiber of biological origin 3 disposed in dispersed state in the metal 2. As shown in FIG. 2, the composite material 1 of the present disclosure has the integrally formed product 4 and a substrate 5 having a surface on which the integrally formed product 4 is formed.

The substrate 5 may be a conductive substrate or may be an insulating substrate. When the substrate 5 is a conductive substrate, examples of the substrate 5 include, for example, metals such as copper and copper alloy, aluminum and aluminum alloy, iron, carbon steel and stainless alloy, or alloys including such a metal as a main component, as well as conductive substrates including carbon, conductive resins and conductive ceramics. On the other hand, when the substrate 5 is an insulating substrate, it may be any substrate having a surface on which the integrally formed product 4 can be formed, and may be for example, insulating substrate such as glass, ceramics and elastomer.

In the integrally formed product 4 of the present disclosure, the fiber of biological origin 3 which have never been reported to be used previously is used as a fiber for constituting the integrally formed product 4 along with a metal 2. As the integrally formed product 4 has such a constitution, it is possible to achieve enhancement of strength, weight reduction and improvement of a sliding property while suppressing degradation of material properties as much as possible such as in particular excellent conductivity inherent in metals.

The type of material of the metal 2 is not particularly limited, and also the shape of the metal 2 is not particularly limited. Examples of the shape of the metal 2 include, for example, foils such as copper foil, nickel foil and aluminum foil, as well as various shapes such as thin plate, thick plate, wire rod material, pipe material, square bar material etc.

As fibers of biological origin 3, it is preferable to use a cellulose fiber, or chitin or chitosan fiber. As fibers of biological origin, it is industrially preferable to use a cellulose fiber, more preferably cellulose microfibril, because of their low environmental load and low material cost. A cellulose microfibril is fine fiber formed from a bundle of several dozens of cellulose molecular chains, and a cellulose fiber is further formed from a bundle of such a cellulose microfibril. The diameter of a cellulose fiber is dozens of µm, while the diameter of a cellulose microfibril is several nm to 0.1 µm. A cellulose microfibril or derivative thereof has excellent properties compared to those of a cellulose fiber such as dispersibility (hydrophilicity), compatibility with other materials, capability of capturing or adsorbing fine particles. Furthermore, a chitin or chitosan fiber not only has an excellent adsorbing capability, but also can be easily subjected to hydrophilizing treatment by forming a derivative.

The fiber of biological origin 3 is preferably a short fiber, and more preferably the short fibers are disposed in dispersed state, particularly in uniformly dispersed state, in the metal 2. Thus, the integrally formed product 4 can attain stable high strength. As for the size of the short fiber, the diameter is preferably 4 to 10 nm, and the length is preferably 5 to 10 µm.

Furthermore, in order to efficiently enhance the strength (in particular tensile strength) in the particular direction, fibers of biological origin 3, in particular short fibers, are preferably dispersed in the metal 2 in an oriented state in one direction. On the other hand, in order to enhance the strength (in particular tensile strength) uniformly in every direction without anisotropy, fibers of biological origin 3, in particular short fibers, are preferably dispersed in the metal 2 in a randomly oriented state.

The integrally formed product 4 is preferably formed by, for example, electroplating method.

The softening temperature (220 to 230° C.) of the fiber of biological origin 3, in particular cellulose fiber, is lower than the melting point of a metal. Therefore, in the case of manufacturing the integrally formed product by the conventional known pressure casting method or sintering method by heating to the temperature at which the metal melts, the cellulose fiber is thermally decomposed, and thus it is not possible to manufacture an integrally formed product using such methods.

On the other hand, since the fiber of biological origin 3 is hydrophilic, it is possible to disperse the fiber of biological origin 3 in a plating solution of the metal 2 without aggregation when the fiber of biological origin 3 is added to the plating solution of various metal 2 formed from an aqueous solution (in particular acidic aqueous solution). Then, by conducting electroplating (dispersal plating) in the plating solution of the metal 2 in which the fiber of biological origin 3 is dispersed, the integrally formed product 4 can be manufactured wherein the fiber of biological origin 3 is disposed in the matrix metal 2 in dispersed state without undergoing property changes such as in particular thermal decomposition. Thus, in the present disclosure, the integrally formed product 4 is preferably formed by electroplating method.

Furthermore, the proportion by mass of the fiber of biological origin 3 contained in the integrally formed product 4 is controlled within a range of 0.02 mass % or more and 10 mass % or less, and is preferably within a range of 0.02 mass % or more and 7 mass % or less. If the above proportion by mass is less than 0.02 mass %, reinforcing effect on the metal 2 by the fiber of biological origin 3 is not sufficient. Thus, the strength of the integrally formed product 4 is not significantly enhanced compared to that of a metal material not containing a fiber of biological origin. When the integrally formed product 4 is formed by electroplating method, if impurities (herein, fibers of biological origin) are contained in the plating solution of the metal 2 in a certain amount or more, the composition of the plating solution changes, and thus metal cannot be precipitated. In particular, if the proportion by mass of the fiber is more than 10 mass %, it tends to be difficult to manufacture the integrally formed product 4 by electroplating method. In addition, for the purpose of suppressing a decrease in conductivity that is too high caused by an increase of proportion of the fiber of biological origin 3 in the matrix metal 2, the proportion by mass of the fibers of biological origin 3 is preferably 7 mass % or less.

The metal 2 is not particularly limited as far as metal is capable for plating, but examples of the metal 2 include, for example, nickel (Ni), copper (Cu), palladium (Pd), silver (Ag), tin (Sn), gold (Au), cobalt (Co), zinc (Zn), iron (Fe), rhodium (Rh) or alloys thereof, and in particular nickel, copper, palladium, tin, silver or gold is preferable. Among these, nickel, copper, palladium or tin is more preferable which is capable for electrodeposition on a conductive substrate by electroplating method using a plating solution of the metal 2 which is an aqueous solution, in particular an acidic aqueous solution, and copper or tin is particularly preferable. Furthermore, among these metals or alloys, it is most suitable to use copper as the metal 2, since particularly copper has high conductivity, and in addition, exhibits significant effect of strength enhancement by the fiber of biological origin 3. As references, examples of plating bath composition and plating conditions of nickel, copper, palladium, silver, tin or gold are shown in Table 1 to Table 6.

TABLE 1

Nickel plating

| Plating bath composition | | Solution property | Bath temperature (° C.) | Current density (A/dm$^2$) |
|---|---|---|---|---|
| Component | Concentration (g/L) | | | |
| Ni(SO$_3$NH$_2$)$_2$•4H$_2$O | 500 | Acidic | 50 | 15 |
| NiCl$_2$ | 30 | | | |
| H$_3$BO$_3$ | 30 | | | |

TABLE 2

Copper plating

| Plating bath composition | | Solution property | Bath temperature (° C.) | Current density (A/dm$^2$) |
|---|---|---|---|---|
| Component | Concentration (g/L) | | | |
| CuSO$_4$•5H$_2$O | 250 | Acidic | 40 | 10 |
| H$_2$SO$_4$ | 50 | | | |
| NaCl | 0.1 | | | |

TABLE 3

Palladium plating

| Plating bath composition | | Solution property | Bath temperature (° C.) | Current density (A/dm$^2$) |
|---|---|---|---|---|
| Component | Concentration | | | |
| Pd(NH$_3$)$_2$Cl$_2$ | 45 g/L | Basic | 80 | 10 |
| NH$_4$OH | 90 m/L | | | |
| (NH$_4$)$_2$SO$_4$ | 50 g/L | | | |
| Palla Sigma brightener (manufactured by Matsuda Sangyo Co., Ltd.) | 10 m/L | | | |

TABLE 4

Silver plating

| Plating bath composition | | Solution property | Bath temperature (° C.) | Current density (A/dm$^2$) |
|---|---|---|---|---|
| Component | Concentration (g/L) | | | |
| AgCN | 50 | Basic | 30 | 2 |
| KCN | 100 | | | |
| K$_2$CO$_3$ | 30 | | | |

TABLE 5

Tin plating

| Plating bath composition | | Solution property | Bath temperature (° C.) | Current density (A/dm$^2$) |
|---|---|---|---|---|
| Component | Concentration (g/L) | | | |
| SnSO$_4$ | 80 | Acidic | 30 | 5 |
| H$_2$SO$_4$ | 80 | | | |

TABLE 6

| Gold plating | | | | |
|---|---|---|---|---|
| Plating bath composition | | | Bath | Current |
| Component | Concentration (g/L) | Solution property | temperature (° C.) | density (A/dm$^2$) |
| KAu(CN)$_2$ | 14.6 | Acidic | 40 | 2 |
| C$_6$H$_8$O$_7$ | 150 | | | |
| K$_2$C$_6$H$_4$O$_7$ | 180 | | | |

For the purpose of reducing temperature increase of the material caused by Joule heat generated at an electrical contact, the decrease in conductivity of the integrally formed product 4 is preferably 30% or less on the basis of the conductivity of the metal 2, more preferably 5% or more and 25% or less.

Furthermore, for the purpose of satisfying the mechanical strength required as an electrical contact material, the increase in tensile strength of the integrally formed product 4 is preferably 5% or more on the basis of the tensile strength of the metal 2, more preferably 30% or more.

When the integrally formed product 4 is formed by electroplating method, the composite material 1 functions as a surface-treated material including the integrally formed product 4 and the substrate 5 having a surface on which the integrally formed product 4 is formed. In such a surface-treated material, the integrally formed product 4 is preferably a surface treatment film laminated on the substrate 5, for example, preferably a plating film formed on the substrate 5 by electroplating. The substrate 5 may be a conductive substrate or may be an insulating substrate depending on the application of the surface-treated material. A conductive substrate and an insulating substrate are not particularly limited, and for example, conductive substrates and insulating substrates illustrated as the above-mentioned substrate 5 can be used.

When the composite material 1 is constituted as a surface-treated material, in order to reduce a decrease of thickness of surface treatment film caused by abrasion during sliding of the electrical contact, a dynamic friction coefficient which represent a sliding property is preferably low. A maximum value of dynamic friction coefficient of such an integrally formed product 4 is preferably 0.8 times or less of that of the metal 2, more preferably within a range of 0.3 to 0.65 times of that of the metal 2, in a reciprocating sliding test in which a steel ball is used as a slider on a surface of the integrally formed product 4 under a load of 100 gf and number of sliding of within 20 to 50.

When the integrally formed product 4 is constituted as a foil such as above-mentioned copper foil, the foil can be formed by, for example, forming the integrally formed product 4 on a rotary cathode drum (conductive substrate) and then peeling off the integrally formed product 4 from the cathode drum.

The thickness of the integrally formed product 4 is not particularly limited, but too large thickness of the integrally formed product 4 results in too high manufacturing cost, thus the upper limit of the thickness is preferably 500 μm or less. When the composite material 1 is constituted as a surface-treated material, only a slight surface treatment on the substrate 5 would provide enhancement of sliding property. Therefore, in terms of durability, the lower limit of the thickness of the integrally formed product 4 is preferably 0.1 μm or more.

In the case that the integrally formed product 4 has a shape of plate, foil or film, as for the average particle size of metal crystal grains in the integrally formed product 4, higher effect of enhancement of strength can be obtained when the average particle size in the direction parallel to the surface of the integrally formed product 4 (longitudinal direction) is smaller than the average particle size in the direction of thickness of the integrally formed product 4. The average particle size of metal crystal grains in the direction parallel to the surface of the integrally formed product 4 is preferably 0.2 μm or more and 5.0 μm or less.

In the above-mentioned embodiment, though the case of manufacturing the integrally formed product 4 by mainly electroplating method has been described, the method of manufacturing is not particularly limited as far as the integrally formed product can be manufactured at a temperature at which material properties of the fiber of biological origin 3 do not change (for example 200° C. or less). Other methods of manufacturing the integrally formed product 4 include, for example, electroless plating method, sol-gel method, various coating method, mixing with a molten metal of a low melting point metal such as a low melting point solder.

[Application of the Integrally Formed Product of the Present Disclosure]

The integrally formed product of the present disclosure can achieve enhancement of strength, weight reduction and improvement of a sliding property while suppressing degradation of material properties as much as possible such as excellent conductivity inherent in metals themselves by selecting a suitable metal for the application, and thus can be applied to various products in various technical fields.

For example, the integrally formed product formed as a foil from copper and a fiber of biological origin can be used as an alternative to a copper foil used for forming a printed wiring board. The printed wiring board including such an integrally formed product can achieve enhancement of strength without decreasing conductivity. In addition, the thickness of the integrally formed product (foil) can be much thinner, and thus the integrally formed product can be adapted to a thinner foil and enhancement of strength that allow higher density, reduced thickness, reduced size and multilayering of a printed wiring board used for a small size electronic equipment such as a cellular phone.

Furthermore, the surface-treated copper plate (composite material) having a surface treatment film (integrally formed product) formed from copper and a fiber of biological origin on a copper plate (conductive substrate) can be used for a terminal for electrical contact which is a component of a connector. The terminal for electrical contact including such a composite material can achieve enhancement of strength of terminal for electrical contact as a whole without decreasing conductivity. Furthermore, it is possible to achieve reduced size, reduced thickness and enhancement of strength of a terminal for electrical contact which allow reduced size of a connector.

Also, the integrally formed product which is integrally formed from tin and fiber of biological origin can be used for a terminal for electrical contact which is a component of a connector. The terminal for electrical contact including such an integrally formed product can achieve improvement of sliding property without decreasing conductivity. Furthermore, it is possible to suppress failures due to sliding at a contact between terminals and achieve improvement of product life.

As stated above, though embodiments of the present disclosure has been described, the present disclosure is not limited to the above embodiments but include all embodiments included within the concept and claims of the present disclosure, and can be modified within the scope of the present disclosure.

EXAMPLES

Next, the present disclosure will be described in more detail based on the examples, but the present disclosure is not limited to these examples.

Examples 1 to 9

The metal listed in Table 7 and a cellulose fiber as a fiber of biological origin were integrally formed in the proportion by mass listed in Table 7 on a copper plate (C1100) having a thickness of 0.3 mm, and it was checked whether the integrally formed product (surface treatment film) could be formed or not. The cellulose fiber having a diameter of about 20 nm and a length of several µm and manufactured by Sugino Machine limited was used as a cellulose fiber. The integrally formed product was manufactured by adding a cellulose fiber to the copper plating bath shown in Table 2 in an amount of about 0.01 to 30% by volume relative to the copper plating bath, stirring the mixture to disperse the fiber in the copper plating bath, then conducting copper electroplating under the condition listed in Table 2 in the copper plating bath in which the cellulose fiber was dispersed to obtain the integrally formed product having a thickness of 5 µm. The proportion by mass of the cellulose fiber contained in the integrally formed product was calculated from the mass of the integrally formed product and the mass of residue remained after dissolving the integrally formed product with dilute sulfuric acid. The residue remained after dissolving the integrally formed product with dilute sulfuric acid was identified as cellulose by Fourier transform infrared spectroscopic analysis.

Example 10

The metal listed in Table 7 and a chitosan fiber as a fiber of biological origin were integrally formed in the proportion by mass listed in Table 7 on a copper plate (C1100) having a thickness of 0.3 mm in the similar way to Examples 1 to 9, and it was checked whether the integrally formed product (surface treatment film) could be formed or not. The chitosan fiber having a diameter of about 20 nm and a length of several µm and manufactured by Sugino Machine limited was used as a chitosan fiber.

Comparative Example 1

The integrally formed product was manufactured in the similar way to Example 1 except that it was manufactured such that the proportion by mass of the cellulose fiber contained in the integrally formed product (surface treatment film) was 0.002%.

Comparative Example 2

Manufacturing of the integrally formed product was attempted such that the proportion by mass of the cellulose fiber contained in the integrally formed product (surface treatment film) was 20%, but the integrally formed product could not be formed.

Comparative Example 3

The integrally formed product was manufactured in the similar way to Example 1 except that it was manufactured such that the proportion by mass of the cellulose fiber contained in the integrally formed product (surface treatment film) was 11%.

Conventional Example 1

Copper electroplating was conducted in the copper plating bath and under the plating condition listed in Table 2 to form copper plating film having a thickness of 5 µm on a copper plate (C1100) having a thickness of 0.3 mm, and thus a copper-plated copper plate was produced.

Example 11

The metal listed in Table 7 and a cellulose fiber were integrally formed in the proportion by mass listed in Table 7 on a copper plate (C1100) having a thickness of 0.3 mm, and it was checked whether the integrally formed product (surface treatment film) could be formed or not. The cellulose fiber having a diameter of about 20 nm and a length of several µm and manufactured by Sugino Machine limited was used as a cellulose fiber. The integrally formed product was manufactured by adding a cellulose fiber to the tin plating bath shown in Table 5 in an amount of about 0.01 to 30% by volume relative to the tin plating bath, stirring the mixture to disperse the fiber in the tin plating bath, then conducting tin electroplating under the condition listed in Table 5 in the tin plating bath in which the cellulose fiber was dispersed to obtain the integrally formed product having a thickness of 5 µm.

Conventional Example 2

Tin electroplating was conducted in the tin plating bath and under the plating condition listed in Table 5 to form a tin plating film having a thickness of 5 µm on a copper plate (C1100) having a thickness of 0.3 mm, and thus a tin-plated copper plate was produced.

Example 12

The metal and a cellulose fiber were integrally formed on a copper plate (C1100) having a thickness of 0.3 mm in the similar way to Example 11 except for nickel plating condition listed in Table 1 and proportion by mass listed in Table 7, and it was checked whether the integrally formed product (surface treatment film) could be formed or not.

Conventional Example 3

Nickel electroplating was conducted in the nickel plating bath and under the plating condition listed in Table 1 to form nickel plating film having a thickness of 5 µm on a copper plate (C1100) having a thickness of 0.3 mm, and thus a nickel-plated copper plate was produced.

Example 13

The metal and a cellulose fiber were integrally formed on a copper plate (C1100) having a thickness of 0.3 mm in the similar way to Example 11 except for palladium plating condition listed in Table 3 and proportion by mass listed in Table 7, and it was checked whether the integrally formed product (surface treatment film) could be formed or not.

Conventional Example 4

Palladium electroplating was conducted in the palladium plating bath and under the plating condition listed in Table 3 to form a palladium plating film having a thickness of 5 μm on a copper plate (C1100) having a thickness of 0.3 mm, and thus a palladium-plated copper plate was produced.

Example 14

The metal and a cellulose fiber were integrally formed on a copper plate (C1100) having a thickness of 0.3 mm in the similar way to Example 11 except for silver plating condition listed in Table 4 and proportion by mass listed in Table 7, and it was checked whether the integrally formed product (surface treatment film) could be formed or not.

Conventional Example 5

Silver electroplating was conducted in the silver plating bath and under the plating condition listed in Table 4 to form a silver plating film having a thickness of 5 μm on a copper plate (C1100) having a thickness of 0.3 mm, and thus a silver-plated copper plate was produced.

Example 15

The integrally formed product (surface treatment film) was formed in the similar way to Example 11 except for gold plating condition listed in Table 6 and proportion by mass listed in Table 7, and it was checked whether the integrally formed product (surface treatment film) could be formed or not.

Conventional Example 6

Gold electroplating was conducted in the gold plating bath and under the plating condition listed in Table 6 to form a gold plating film having a thickness of 5 μm on a copper plate (C1100) having a thickness of 0.3 mm, and thus a gold-plated copper plate was produced.

As properties of each produced surface treatment film (plating film), tensile strength, conductivity, and dynamic friction coefficient were measured in the following methods.

[Evaluation Method]

1. Measurement of Tensile Strength

A surface treatment film (plating film) having a thickness of 10 μm was formed on a cathode electrode (titanium plate), and then the surface treatment film was peeled off from the titanium plate to produce a foil (sample material) including the surface treatment film (plating film). Tensile tests were conducted according to JIS Z2241:2011 for each produced 3 foils (sample materials), and the average value thereof was obtained.

2. Measurement of Conductivity

A surface treatment film (plating film) having a thickness of 10 μm was formed on a cathode electrode (titanium plate) in the similar way to the measurement of tensile strength, and then the surface treatment film was peeled off from the titanium plate to produce a foil (sample material) including the surface treatment film (plating film). Specific resistance values were measured for each produced 3 foils (sample materials) by four-terminal method in a thermostatic chamber maintained at 20° C. (±0.5° C.). Conductivity was calculated from the measured specific resistance value and the average value thereof was obtained. The distance between terminals were 200 mm.

3. Measurement of Dynamic Friction Coefficient

The composite material (surface-treated material) was produced which has a copper plate (C1100) having a thickness of 0.3 mm on which the integrally formed product (surface treatment film) shown in Table 7 was formed. Measurement of dynamic friction coefficient was conducted for each produced 3 composite materials (sample materials) using the sliding test machine (product name: HEIDON Type: 14FW, manufactured by SHINTO Scientific Co., ltd.). Measurement conditions were as follows. R=3.0 mm steel ball probe, sliding distance: 10 mm, sliding speed: 100 mm/min, number of reciprocating sliding: 50, load: 100 gf. Dynamic friction coefficient was evaluated by the ratio of the maximum value of dynamic friction coefficient of the composite material relative to that of the original metal film not containing a fiber of biological origin (dynamic friction coefficient ratio) under a number of sliding of within 20 to 50.

TABLE 7

| | Composite material | | | | | Whether the integrally formed product can be formed or not Yes o/ No x | Evaluation of performance | | | |
|---|---|---|---|---|---|---|---|---|---|---|
| | | | Integrally formed product | | | | Tensile strength | | Conductivity | | Ratio of dynamic friction coefficient |
| | Substrate | Metal | Cellulose fiber | Chitosan fiber | Film thickness | | | Rate of increase | | Rate of decrease | |
| | Type | Type | Proportion by mass (mass %) | | (μm) | | (Mpa) | (%) | (% IACS) | (%) | |
| Conventional example 1 | Cu plate | Cu plating | 100 | 0 | — | 5 | Yes | 250 | Basis | 100 | Basis | Basis |
| Comparative example 1 | Cu plate | Cu plating | 99.998 | 0.002 | — | 5 | Yes | 253 | 0 | 99 | 1 | 0.98 |
| Comparative example 2 | Cu plate | Cu plating | 80 | 20 | — | — | No | — | — | — | — | — |
| Comparative example 3 | Cu plate | Cu plating | 89 | 11 | — | 5 | Yes | 1183 | 373.2 | 63 | 37.0 | 0.26 |
| Example 1 | Cu plate | Cu plating | 99.98 | 0.02 | — | 5 | Yes | 263 | 5.2 | 95 | 5.0 | 0.85 |
| Example 2 | Cu plate | Cu plating | 99.8 | 0.2 | — | 5 | Yes | 325 | 30.8 | 94 | 6.0 | 0.57 |
| Example 3 | Cu plate | Cu plating | 99 | 1 | — | 5 | Yes | 399 | 59.6 | 92 | 8.0 | 0.51 |
| Example 4 | Cu plate | Cu plating | 98 | 2 | — | 5 | Yes | 538 | 115.2 | 89 | 11.0 | 0.45 |
| Example 5 | Cu plate | Cu plating | 97 | 3 | — | 5 | Yes | 678 | 171.2 | 86 | 14.0 | 0.41 |
| Example 6 | Cu plate | Cu plating | 96 | 4 | — | 5 | Yes | 813 | 225.2 | 84 | 16.0 | 0.37 |
| Example 7 | Cu plate | Cu plating | 95 | 5 | — | 5 | Yes | 957 | 282.8 | 81 | 19.0 | 0.35 |
| Example 8 | Cu plate | Cu plating | 93 | 7 | — | 5 | Yes | 1094 | 337.6 | 76 | 24.0 | 0.3 |
| Example 9 | Cu plate | Cu plating | 92 | 8 | — | 5 | Yes | 1135 | 354 | 72 | 28.0 | 0.28 |

TABLE 7-continued

| | | Composite material | | | | Whether the integrally formed product can be formed or not Yes ○/ No x | Evaluation of performance | | | | |
|---|---|---|---|---|---|---|---|---|---|---|---|
| | | Integrally formed product | | | | | Tensile strength | | Conductivity | | Ratio of dynamic friction coefficient |
| | Substrate | Metal | Cellulose fiber | Chitosan fiber | Film thickness | | | Rate of increase | | Rate of decrease | |
| | Type | Type | Proportion by mass (mass %) | | (μm) | | (Mpa) | (%) | (% IACS) | (%) | |
| Example 10 | Cu plate | Cu plating | 99 | — | 1 | 5 | Yes | 332 | 32.8 | 91 | 9.0 | 0.62 |
| Conventional example 2 | Cu plate | Sn plating | 100 | 0 | — | 5 | Yes | 48 | Basis | 13 | Basis | Basis |
| Example 11 | Cu plate | Sn plating | 99.8 | 0.2 | — | 5 | Yes | 52 | 70.8 | 12 | 8.3 | 0.52 |
| Conventional example 3 | Cu plate | Ni plating | 100 | 0 | — | 5 | Yes | 545 | Basis | 20 | Basis | Basis |
| Example 12 | Cu plate | Ni plating | 99 | 1 | — | 5 | Yes | 716 | 31.3 | 19 | 5.3 | 0.64 |
| Conventional example 4 | Cu plate | Pd plating | 100 | 0 | — | 5 | Yes | 426 | Basis | 14 | Basis | Basis |
| Example 13 | Cu plate | Pd plating | 98 | 2 | — | 5 | Yes | 780 | 83.1 | 12 | 15 | 0.48 |
| Conventional example 5 | Cu plate | Ag plating | 100 | 0 | — | 5 | Yes | 212 | Basis | 102 | Basis | Basis |
| Example 14 | Cu plate | Ag plating | 98 | 2 | — | 5 | Yes | 406 | 91.5 | 89 | 13 | 0.51 |
| Conventional example 6 | Cu plate | Au plating | 100 | 0 | — | 5 | Yes | 153 | Basis | 74 | Basis | Basis |
| Example 15 | Cu plate | Au plating | 99 | 1 | — | 5 | Yes | 286 | 73.8 | 68 | 8 | 0.44 |

As can be seen from Table 7, when comparing the cases in which a metal is copper plating (Examples 1 to 10, Conventional example 1 and Comparative examples 1 to 3), Comparative example 1 in which the proportion by mass of the cellulose fiber contained in the integrally formed product (surface treatment film) was less than 0.02 mass % was found to be not advantageous in tensile strength compared to Conventional example 1. In particular, in any of Examples 1 to 8 in which the proportion by mass of the cellulose fiber contained in the integrally formed product (surface treatment film) is within a range of 0.02 mass % or more and 7 mass % or less, the rate of increase in tensile strength was significantly higher than the rate of decrease in conductivity. Among these, Examples 2 to 8 in which the proportion by mass of the cellulose fiber is within a range of 0.2 mass % or more and 7 mass % or less provided particularly excellent results: in particular, the increase in tensile strength was 30% or more, the decrease in conductivity was 25% or less, and the ratio of dynamic friction coefficient was less than 0.65.

In Example 9 in which the proportion by mass of the cellulose fiber contained in the integrally formed product (surface treatment film) was 8 mass %, though the increase in tensile strength was high, the decrease in conductivity was higher compared to the cases in which the proportion by mass of the cellulose fiber contained in the integrally formed product (surface treatment film) is 0.02 mass % or more and 7 mass % or less.

On the other hand, in Comparative example 2, a composite material could not be formed since the proportion by mass of the cellulose fiber was too high. Furthermore, in Comparative example 3, the decrease in conductivity was significantly higher compared to the increase in tensile strength.

In Example 10 in which the fiber of biological origin is chitosan fiber, the increase in tensile strength was significantly higher compared to the decrease in conductivity.

When comparing Example 11 with Conventional example 2, in both of which the metal is tin plating, the decrease in conductivity was lower and the increase in tensile strength was significantly higher in Example 11 compared to Conventional example 2.

When comparing Example 12 with Conventional example 3, in both of which the metal is nickel plating, the decrease in conductivity was lower and the increase in tensile strength was significantly higher in Example 12 compared to Conventional example 3.

When comparing Example 13 with Conventional example 4, in both of which the metal is palladium plating, the decrease in conductivity was lower and the increase in tensile strength was significantly higher in Example 13 compared to Conventional example 4.

When comparing Example 14 with Conventional example 5, in both of which the metal is silver plating, the decrease in conductivity was lower and the increase in tensile strength was significantly higher in Example 14 compared to Conventional example 5.

When comparing Example 15 with Conventional example 6, in both of which the metal is gold plating, the decrease in conductivity was lower and the increase in tensile strength was significantly higher in Example 15 compared to Conventional example 6.

Examples 16 to 19

The metal and a cellulose fiber were integrally formed on a copper plate (C1100) having a thickness of 0.3 mm in the similar way to Examples 1 to 9 except for the proportion by mass listed in Table 8 to form surface treatment films (integrally formed products) having various film thickness.

Conventional Example 7

Copper electroplating was conducted in the copper plating bath and under the plating condition listed in Table 2 to form copper plating film having a thickness of 20 μm on a copper plate (C1100) having a thickness of 0.3 mm, and thus a copper-plated copper plate was produced.

For Examples 16 to 19 and Conventional example 7, tensile strength, conductivity and dynamic friction coefficient were measured in the similar way to Examples 1 to 15.

TABLE 8

| | Composite material | | | | Evaluation of performance | | | | |
| --- | --- | --- | --- | --- | --- | --- | --- | --- | --- |
| | | Integrally formed product | | | Tensile strength | | Conductivity | | Ratio of dynamic friction coefficient |
| | Substrate | Metal | Cellulose fiber | Film thickness | | Rate of increase | | Rate of decrease | |
| | Type | Type | Proportion by mass (mass %) | (μm) | (Mpa) | (%) | (% IACS) | (%) | |
| Conventional example 7 | Cu plate | Cu plating | 100 | 0 | 20 | 250 | Basis | 100 | Basis | Basis |
| Example 16 | Cu plate | Cu plating | 95 | 5 | 0.1 | 957 | 282.8 | 81 | 19.0 | 0.30 |
| Example 17 | Cu plate | Cu plating | 95 | 5 | 0.5 | 957 | 282.8 | 81 | 19.0 | 0.32 |
| Example 18 | Cu plate | Cu plating | 95 | 5 | 20 | 957 | 282.8 | 81 | 19.0 | 0.38 |
| Example 19 | Cu plate | Cu plating | 95 | 5 | 500 | 957 | 282.8 | 81 | 19.0 | 0.42 |

As can be seen from Table 8, also in the case that the film thickness of the integrally formed product is within a range of 0.1 μm or more and 500 μm or less, the increase in tensile strength, the decrease in conductivity and the ratio of dynamic friction coefficient were excellent, similarly to Examples 1 to 9.

What is claimed is:

1. An integrally formed product comprising a metal and a fiber of biological origin dispersed in the metal,
   wherein a proportion by mass of the fiber of biological origin contained in the integrally formed product is within a range of 0.02 mass % or more and 10 mass % or less, and the metal is copper or tin.

2. The integrally formed product according to claim 1, wherein the fiber of biological origin is a cellulose fiber.

3. The integrally formed product according to claim 1, wherein the fiber of biological origin is a chitin or a chitosan fiber.

4. The integrally formed product according to claim 1, wherein the fibers of biological origin are dispersed in the metal under a state of being oriented in one direction.

5. The integrally formed product according to claim 1, wherein the fibers of biological origin are dispersed in the metal under a state of being arranged in random directions.

6. The integrally formed product according to claim 1, wherein a decrease in conductivity of the integrally formed product is 30% or less compared to a conductivity of the metal.

7. The integrally formed product according to claim 1, wherein an increase in tensile strength of the integrally formed product is 5% or more compared to a tensile strength of the metal.

8. The integrally formed product according to claim 1, wherein a ratio of maximum value of dynamic friction coefficient of the integrally formed product is 0.8 less relative to that of the metal in a reciprocating sliding test in which a steel ball is used as a slider on a surface of the integrally formed product under a load of 100 gf and number of sliding of within 20 to 50.

9. The integrally formed product according to claim 1, wherein a proportion by mass of the fiber of biological origin contained in the integrally formed product is within a range of 0.02 mass % or more and 7 mass % or less.

10. A method of manufacturing the integrally formed product according to claim 1, wherein the integrally formed product is formed by electroplating method.

11. A composite material comprising the integrally formed product according to claim 1 and a substrate having a surface on which the integrally formed product is formed.

12. The composite material according to claim 11, wherein the substrate is a conductive substrate.

13. The composite material according to claim 11, wherein the substrate is an insulating substrate.

14. A terminal for electrical contact comprising an integrally formed product comprising a metal and a fiber of biological origin dispersed in the metal,
   wherein a proportion by mass of the fiber of biological origin contained in the integrally formed product is within a range of 0.02 mass % or more and 10 mass % or less.

15. A printed wiring board comprising the integrally formed product according to claim 1.

* * * * *